United States Patent
Andreev et al.

(10) Patent No.: US 7,096,413 B2
(45) Date of Patent: Aug. 22, 2006

(54) DECOMPOSER FOR PARALLEL TURBO DECODING, PROCESS AND INTEGRATED CIRCUIT

(75) Inventors: Alexander E. Andreev, San Jose, CA (US); Ranko Scepanovic, San Jose, CA (US); Vojislav Vukovic, Santa Clara, CA (US)

(73) Assignee: LSI Logic Corporation, Milpitas, CA (US)

( * ) Notice: Subject to any disclaimer, the term of this patent is extended or adjusted under 35 U.S.C. 154(b) by 460 days.

(21) Appl. No.: 10/299,270

(22) Filed: Nov. 19, 2002

(65) Prior Publication Data

US 2004/0098653 A1 May 20, 2004

(51) Int. Cl.
*H03M 13/03* (2006.01)
*G06F 11/00* (2006.01)
(52) U.S. Cl. .................................. 714/794; 714/701
(58) Field of Classification Search ............... 714/794, 714/701
See application file for complete search history.

(56) References Cited

U.S. PATENT DOCUMENTS 4,700,294 A * 10/1987 Haynes ..................... 341/106
5,550,774 A * 8/1996 Brauer et al. ........... 365/189.02

* cited by examiner

*Primary Examiner*—Joseph Torres
(74) *Attorney, Agent, or Firm*—Westman, Champlin & Kelly

(57) ABSTRACT

A decoder for access data stored in n memories comprises a function matrix containing addresses of the memory locations at unique coordinates. A decomposer sorts addresses from coordinate locations of first and second m×n matrices, such that each row contains no more than one address from the same memory. Positional apparatus stores entries in third and fourth m×n matrices identifying coordinates of addresses in the function matrix such that each entry in the third matrix is at coordinates that matches corresponding coordinates in the first matrix, and each entry in the fourth matrix is at coordinates that matches corresponding coordinates in the second matrix. The decoder is responsive to entries in the matrices for accessing data in parallel from the memories.

16 Claims, 3 Drawing Sheets

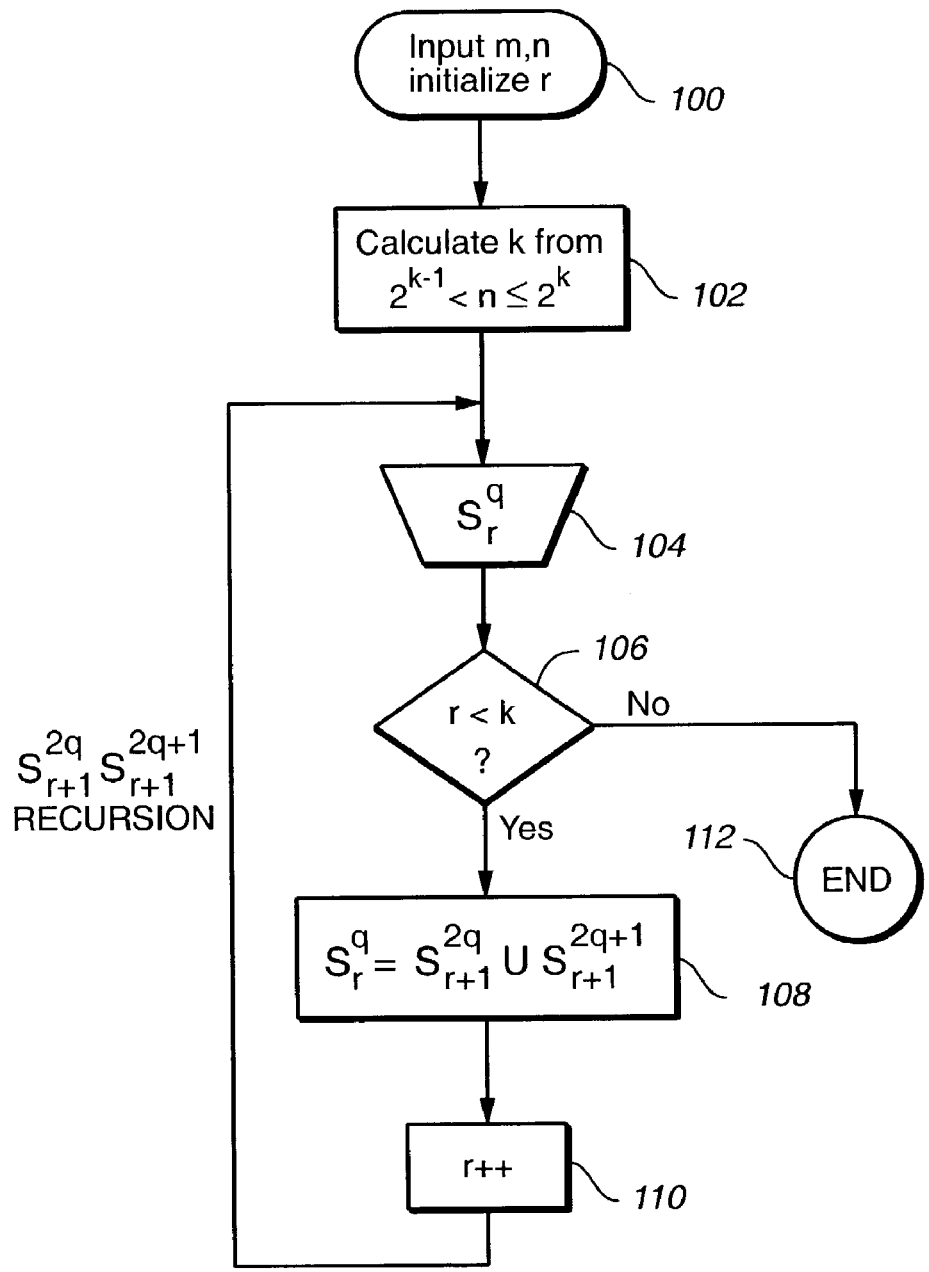
FIG._1

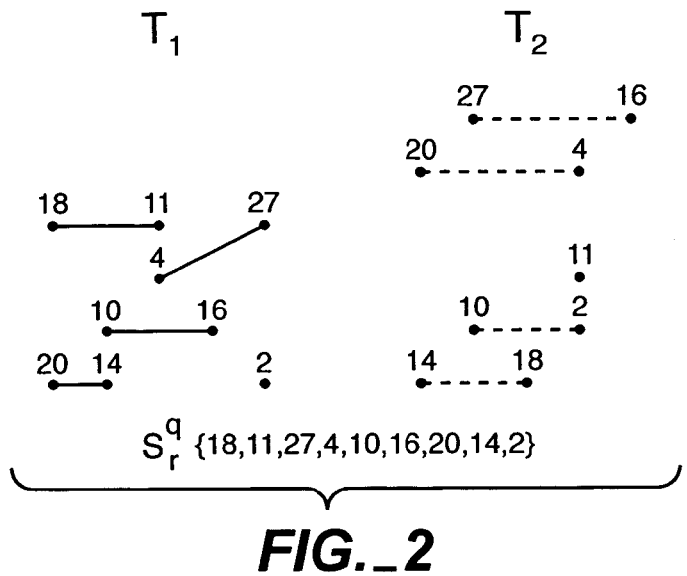
FIG._2
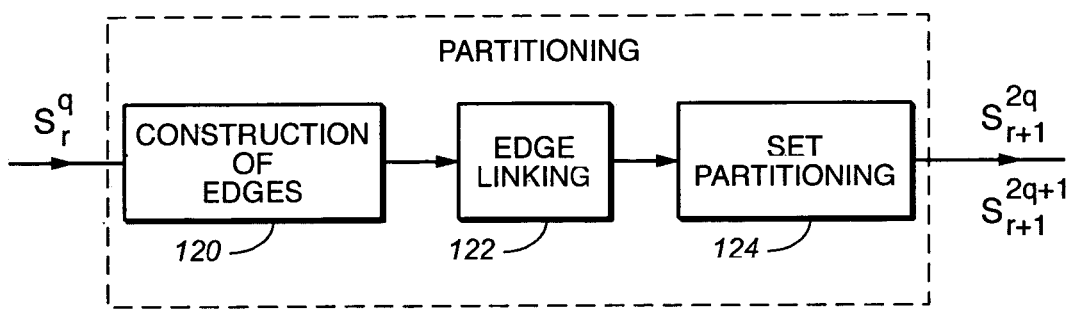
FIG._3
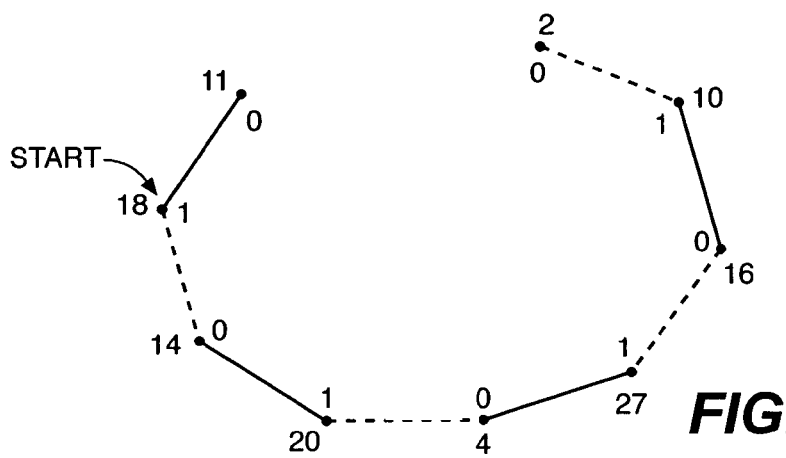
FIG._4

$T_1$
```
25   4  27  41  20
42  31  33  38  17
21   5   1  19  34
36  16  18  40  10
 0  23  11  26  44
22   9  37  12  35
43   3  15   7  30
 8  32  24  14  29
 2  28   6  39  13
```

$T_2$
```
42  43   7   1   6
27  23  10  29  13
26  15  38  19  40
12  37   9  32  36
14  25  22  33  28
 8  41   4  30   5
16   0  35  11   3
34  20   2  18  31
44  21  24  17  39
```

$f$
```
 4  42  33  27  20  25  31  41
17  19  34  21  38   5   1  10
 0  18  26  36  23  16  40  44
 9   3  12  35  37  43  11  22
29  14   7   8  30  24  32  15
 6          28  39  13       2
```

$P_1$
```
(0,5)  (0,0)  (0,3)  (0,7)  (0,4)
(0,1)  (0,6)  (0,2)  (1,4)  (1,0)
(1,3)  (1,5)  (1,6)  (1,1)  (1,2)
(2,3)  (2,5)  (2,1)  (2,6)  (1,7)
(2,0)  (2,4)  (3,6)  (2,2)  (2,7)
(3,7)  (3,0)  (3,4)  (3,2)  (3,3)
(3,5)  (3,1)  (4,7)  (4,2)  (4,4)
(4,3)  (4,6)  (4,5)  (4,1)  (4,0)
(5,7)  (5,3)  (5,0)  (5,4)  (5,5)
```

$P_2$
```
(0,1)  (3,5)  (4,2)  (1,6)  (5,0)
(0,3)  (2,4)  (1,7)  (4,0)  (5,5)
(2,2)  (4,7)  (1,4)  (1,1)  (2,6)
(3,2)  (3,4)  (3,0)  (4,6)  (2,3)
(4,1)  (0,5)  (3,7)  (0,2)  (5,3)
(4,3)  (0,7)  (0,0)  (4,4)  (1,5)
(2,5)  (2,0)  (3,3)  (3,6)  (3,1)
(1,2)  (0,4)  (5,7)  (2,1)  (0,6)
(2,7)  (1,3)  (4,5)  (1,0)  (5,4)
```

The Input/Output Matrices, m=9, n=5

DECOMPOSER FOR PARALLEL TURBO DECODING, PROCESS AND INTEGRATED CIRCUIT

FIELD OF THE INVENTION

This invention relates to parallel data processing, and particularly to integrated circuits that perform parallel turbo decoding.

BACKGROUND OF THE INVENTION

Data processing systems using convolutional codes are theoretically capable of reaching the Shannon limit, a theoretical limit of signal-to-noise for error-free communications. Prior to the discovery of turbo codes in 1993, convolutional codes were decoded with Viterbi decoders. However, as error correction requirements increased, the complexity of Viterbi decoders exponentially increased. Consequently, a practical limit on systems employing Viterbi decoders to decode convolutional codes was about 3 to 6 dB from the Shannon limit. The introduction of turbo codes allowed the design of practical decoders capable of achieving a performance about 0.7 dB from the Shannon limit, surpassing the performance of convolutional-encoder/Viterbi-decoders of similar complexity. Therefore, turbo codes offered significant advantage over prior code techniques.

Convolutional codes are generated by interleaving data. There are two types of turbo code systems: ones that use parallel concatenated convolutional codes, and ones that use serially concatenated convolutional codes. Data processing systems that employ parallel concatenated convolutional codes decode the codes in several stages. In a first stage, the original data (e.g. sequence of symbols) are processed, and in a second stage the data obtained by permuting the original sequence of symbols is processed, usually using the same process as in the first stage. The data are processed in parallel, requiring that the data be stored in several memories and accessed in parallel for the respective stage. However, parallel processing often causes conflicts. More particularly, two or more elements or sets of data that are required to be accessed in a given cycle may be in the same memory, and therefore not accessible in parallel. Consequently, the problem becomes one of organizing access to the data so that all required data can simultaneously accessed in each of the processing stages.

Traditionally, turbo decoding applications increased throughput by adding additional parallel turbo decoders. However, in integrated circuit (IC) designs, the additional decoders were embodied on the IC and necessarily increased chip area dramatically. There is a need for a turbo decoder that achieves high throughput without duplication of parallel turbo decoders, thereby achieving reduced IC chip area.

SUMMARY OF THE INVENTION

The present invention is directed to a decomposer for turbo decoders, which makes possible parallel access to direct and interleaved information. When implemented in an IC chip, the decomposer eliminates the need for turbo decoder duplications, thereby significantly reducing chip area over prior decoders.

In one form of the invention, a process is provided to access data stored at addressable locations in n memories. A function matrix is provided having coordinates containing addresses of the addressable locations in the memories. A set of addresses from first and second matrices, each having m rows and n columns, is sorted into unique coordinate locations such that each row contains no more than one address of a location from each respective memory. Third and fourth matrices are created, each having m rows and n columns. The third and fourth matrices contain entries identifying coordinates of addresses in the function matrix such that each entry in the third matrix is at coordinates that matches corresponding coordinates in the first matrix and each entry in the fourth matrix is at coordinates that matches corresponding coordinates in the second matrix. Data are accessed in parallel from the memories using the matrices.

In some embodiments, the addresses are organized into first and second sets, $S_r^q$, each containing the addresses. The sets are sorted into the first and second matrices. More particularly, for each set, a plurality of edges between the addresses are identified such that each edge contains two addresses, and each address is unconnected or in not more than two edges. The edges are linked into a sequence, and are alternately assigned to the first and second sets.

In some embodiments, each set, $S_r^q$, of addresses is iteratively divided into first and second subsets $S_{r+1}^{2q}$ and $S_{r+1}^{2q+1}$ which are placed into respective rows of the respective first and second matrices, until each row contains no more than one address of a location in each respective memory.

In other embodiments, a decomposer is provided to decompose interleaved convolutional codes. The decomposer includes the first, second, third and fourth matrices.

In yet other embodiments, an integrated circuit includes a decoder and a decomposer including the first, second, third and fourth matrices.

BRIEF DESCRIPTION OF THE DRAWINGS

FIG. 1 is a flowchart of a process of partitioning data into memories in accordance with an aspect of the present invention.

FIGS. 2–5 are illustrations useful in explaining the process of FIG. 1.

DETAILED DESCRIPTION OF THE PREFERRED EMBODIMENTS

The present invention is directed to a decomposer for turbo code decoding, which eliminates the need for turbo decoder duplications. It employs matrices, herein designated $T_1$, $T_2$, $P_1$, $P_2$ and f, which are embodied in memory arrays or the like.

The premise of the present invention can be generalized by considering two arbitrary permutations of a set of numbers, which represents addresses in n memories where data for processing are stored. Assume that each memory is capable of storing a maximal number, m, of words. The addresses can be represented in two tables (matrices), one for each processing stage. Each table has m rows and n columns, and each row represents addresses to be accessed simultaneously during a given clock cycle. Each column represents the addresses in one memory.

In accordance with the present invention, the addresses are partitioned into groups such that each row in each of the two tables does not contain more than one address from the same group. Then, stored data from the same group of addresses in one memory allow simultaneous access to all addresses from any row and any table through access to different memories.

The algorithm to partition addresses uses input integer numbers m and n, and two m×n matrices, $T_1$ and $T_2$, which represent two different permutations of a set of numbers $S=\{0,1,2,\ldots,n*m-1\}$. The numbers of set S represent addresses in the respective memory. The process of the present invention determines a function whose input set is in the form of $\{0,1,2,\ldots,n*m-1\}$ and provides an output set $\{0,1,2,\ldots,2^k-1\}$, where $2^{k-1}<n\leq 2^k$, $f:\{0,1,2,\ldots,n*m-1\}\to f:\{0,1,2,\ldots,2^k-1\}$, such that for every i, $j_1$, $j_2$ the relationship $f(T\alpha[i][j_1])!=f(T\alpha[i][j_2])$ is satisfied, where $\alpha=1,2$. The resulting partitioning gives $2^k$ subsets of S, one for each function value, such that set S is represented as $S=S_0\cup S_1\cup S_2\ldots\cup S_{2^k-1}$.

The output of the algorithm is a set of matrices, $T_1$ and $T_2$, which provides the addresses of the memories (numbers from 0 to $2^k-1$) and the local addresses of all data required to be accessed simultaneously within the memories for a processing stage.

Set S is partitioned in k stages. An intermediate stage is denoted by r, where $0\leq r<k$. At each stage, set $S_r^q$ is divided into two subsets $S_{r+1}^{2q}$ and $S_{r+1}^{2q+1}$, where q is an index symbolically denoting the original set, q, divided into two new sets, 2q and 2q+1. Starting with r=0,q=1, the initial set, $S=S_r^q$, is divided into two subsets $S_{r+1}^{2q}$ and $S_{r+1}^{2q+1}$. At the next stage, sets $S_{r+1}^{2q}$ and $S_{r+1}^{2q+1}$ are each divided to two descendants, $S_{r+1}^{2q}=S_{r+2}^{2(2q)}\cup S_{r+2}^{2(2q+1)}$ and $S_{r+1}^{2q+1}=S_{r+2}^{2(2q+1)}\cup S_{r+2}^{2(2q+1)+1}$. The partitioning iterates until r=k, at which point the number of elements in each row is either 0 or 1. For example, for the initial set where r=0, $S=S_0^q$, is divided into two subsets $S_1^{2q}$ and $S_1^{2q+1}$; sets $S_1^{2q}$ and $S_1^{2q+1}$ are each divided to two descendants, $S_1^{2q}=S_2^{2(2q)}\cup S_2^{2(2q+1)}$ and $S_1^{2q+1}=S_2^{2(2q+1)}\cup S_2^{2(2q+1)+1}$.

The number of elements in each intermediate set is one of the two integers closest to $m*n*2^{-r}$ if it is not already an integer so that both intermediate sets has $m*n*2^{-r}$ points. For each intermediate set in the process, the number of set elements in a single row, m, of matrices $T_1$ and $T_2$ is less than or equal to $n*2^{-r}$.

At the end point (where r=k), the number of elements from each set $S_{2^k-1}^q$ in each row of matrices $T_1$ and $T_2$ is equal 0 or 1, meaning that function f is determined (the indexes of subsets $S_{2^k-1}^q$ are values of f) and there is no need for further partitioning. Thus, there is no row, m, in either matrix $T_1$ and $T_2$, which contains more than one element from the same subset. Hence, all numbers in a row have different function values.

The process of the partitioning algorithm is illustrated in FIG. 1. The process commences at step 100 with the input of the number n of memories and the size m of each memory. The value of r is initialized at 0. At step 102, k is calculated from the relationship $2^{k-1}<n\leq 2^k$. $S_r^q$ is generated at step 104. Thus, at the first iteration, $S_0^q$ is generated. If, at step 106, r is smaller than k, then at step 108 $S_r^q$ is divided as $S_r^q=S_{r+1}^{2q}\cup S_{r+1}^{2q+1}$. At step 110, the value of r is incremented by one and the process loops back to step 104 to operate on the recursions $S_1^{2q}$ and $S_1^{2q+1}$. Assuming r is still smaller at k at step 106, for the second iteration where r=1, $S_1^{2q}$ is divided as $S_1^{2q}=S_2^{2(2q)}\cup S_2^{2(2q)+1}$ and $S_1^{2q+1}$ is divided as $S_1^{2q+1}=S_2^{2(2q+1)}\cup S_2^{2(q+1)+1}$. The process continues until r is equal to k at step 106. As long as r<k, the number of $S_r^q$ elements (addresses) resulting from each iteration of division in one row of $T_1$ and $T_2$ may be more than one. When r=k, each division result contains one or no $S_r^q$ elements in a row of $T_1$ and $T_2$. The process ends at step 112, and the set S is partitioned into $2^k$ subsets.

Consider a set $S_r^q=\{18,11,27,4,10,16,20,14,2\}$ representing memory elements (addresses) at some partitioning stage.

The object is to partition $S_r^q$ into subsets such that upon completion of the final stage there are no two elements from the same set in the same row of tables $T_1$ and $T_2$ (FIG. 2). FIG. 3 illustrates the process of partitioning, which includes a first step 120 that constructs two sets of edges, one set per table. The second step 122 links the constructed edges into lists, which are then used in the final step 124 to produce two subsets $S_{r+1}^{2\alpha}$ and $S_{r+1}^{2q+1}$ for each table.

At step 120, the edges are constructed by connecting two adjacent points in each row. As used herein, the term "point" refers to corresponding numbers in the input set. If the row contains an odd number of points, the remaining point is connected with next remaining point from the next row that also has odd number of elements. If, after all rows are processed, there is still a point without a pair, that point is left unconnected. For the example of FIG. 2, the two edge sets are $E_1=\{(18,11), (27,4), (10,16), (20,14)\}$ and $E_2=\{(27,16), (20,4), (10,2), (14,18)\}$.

Points 2 in $T_1$ and 11 in $T_2$ are unconnected.

At step 122, the edges and points identified in step 120 are linked into lists. Each list starts at a point and ends at the same or different point. This step starts at any point from the set being divided, and looks alternately in tables $T_1$ and $T_2$ for list elements. For purposes of illustration, assume the starting point is point 18 and table $T_1$ in FIG. 2. Edge (18,11) is the first in the list. Next, a point (if it exists) is found in table $T_2$ that is connected to the end of edge (18,11). In this case point 11 is not connected to any other point in table $T_2$, so point 18, from the start of the edge is considered. In this case, table $T_2$ identifies that point 14 is connected in an edge with point 18. Because the edge (14,18) found in table $T_2$ is connected to the first point (18) of edge (18,11), the direction of movement through the list is reversed and edge (14,18) is added to the trailing end. Next the process looks for a point in table $T_1$ connected to the end (point 14) of list in the direction of movement. Because point 14 is edged with point 20 in table $T_1$, point 20 is the next point of the list. The process continues until the second end of the list (point 2) is reached. If, at the end of the list, all points from the set $S_r^q$ are included in the linking, the linking operation is finished. If there are points that do not belong to any list, a new list is started. In the example of FIG. 2, all points are in one list. There may be any number of lists and there may be none or one "isolated" (unconnected) point.

After completing the linkages of step 122, the points are identified as odd or even, starting from any point. The starting point and all points separated by an odd number of points from the starting point (all even points) are inserted into $S_{r+1}^{2q}$. All other points (all odd points) are inserted into $S_{r+1}^{2q+1}$. For example, the points can be indexed with 0 and 1 so that neighboring points have different indices. Thus, all points with a "0" index are inserted into one set ($S_{r+1}^{2q}$) and all points with a "1" index are in the other set ($S_{r+1}^{2q+1}$). In the example of FIG. 2, starting indexing at point 11, the result of this dividing are sets: $S_{r+1}^{2q}=\{11,14,4,16,2\}$ and $S_{r+1}^{2q+1}=\{18,20,27,10\}$. Sets $S_{r+1}^{2q}$ and $S_{r+1}^{2q+1}$ are further partitioned until k=r and no row contains more than one element from the original set, $S_r^q$.

The outputs of the process are function f matrix and two "positional" matrices, $P_1$ and $P_2$, that identify the position of elements in starting tables (matrices) $T_1$ and $T_2$. The four matrices $P_1$, $P_2$, $T_1$ and $T_2$ allow necessary parallelism in data reading. Function f is represented in the form of a matrix whose column indices are its values and column elements are numbers from the input set which have that value. Thus, in FIG. 5 each column of matrix f contains addresses from one memory. The positional matrices $P_1$ and $P_2$ have the same dimensions as matrices $T_1$ and T2, namely m×n. For each position (i,j) in a matrix $T_1$ or $T_2$, the corresponding position in the corresponding matrix $P_1$ or $P_2$ identifies a position of the corresponding element, $T_1[i][j]$ or $T_2[i][j]$, in matrix f. For example, in FIG. 5 element $T_1[2][1]$=5 in matrix $T_1$ identifies a position (i,j) in positional matrix $P_1$ of element $P_1[2][1]$. Element $P_1[2][1]$ identifies the row and column coordinates (1,5) of element $T_1[2][1]$=5 in matrix f. In matrix $T_2$, element $T_2[5][4]$=5 identifies positional element $P_2[5][4]$ which identifies the coordinates (1,5) in matrix f of $T_2[5][4]$=5. Similarly, in matrix $T_2$, element $T_2[2][1]$ identifies the (i,j) position in positional matrix $P_2$, which in turn identifies the row and column coordinates (4,7) of element $T_2[2][1]$=15 in matrix f.

Decoding turbo codes is performed using the T1 and T2 matrices, together with the P1 and P2 positional matrices, by accessing one of the T1 or T2 matrices during each parallel processing stage, and, using the corresponding positional matrix P1 or P2, to identify the address in the function matrix, where each column of the function matrix represents a different memory in the system of memories. For example, if a parallel operation required data from the third row of matrix T1 (addresses 21, 5, 1, 19, 34), matrix T1 would identify coordinates (2,0), (2,1), (2,2), (2,3) and (2,4), pointing to corresponding coordinates in matrix P1 where coordinates (1,3), (1,5), (1,6), (1,1) and (1,2) are stored. These are the coordinates of required addresses in function matrix f and each is placed in different columns (memories).

Although the present invention has been described with reference to preferred embodiments, workers skilled in the art will recognize that changes may be made in form and detail without departing from the spirit and scope of the invention.

What is claimed is:

1. A process of decomposing a set of parallel concatenated convolutional codes to select an address of an addressable location in each of a plurality of memories of up to n memories so that the selected addressable locations can be accessed in parallel, comprising steps of:
   a) providing a function matrix and first and second matrices implemented at least in part in an integrated circuit, the function matrix having unique coordinates containing addresses of the addressable locations in the memories;
   b) sorting a set of addresses of addressable locations into unique coordinate locations of the first and second matrices, each having m rows and n columns, such that each row contains no more than one address of a location in any one memory;
   c) creating third and fourth matrices at least in part in the integrated circuit, each having m rows and n columns, the third and fourth matrices containing entries identifying coordinates of addresses in the function matrix, the entries being arranged at unique coordinate locations in the third and fourth matrices so that each entry in the third matrix is at coordinates that match coordinates in the first matrix containing an address, and each entry in the fourth matrix is at coordinates that match coordinates in the second matrix containing an address; and
   d) decoding the set of convolutional codes using the function, first, second, third and fourth matrices to select an address of an addressable location in each of the plurality of memories.

2. The process of claim 1, wherein the function matrix contains addresses from the first and second matrices arranged for parallel access.

3. The process of claim 1, wherein step b) includes steps of:
   b1) organizing the addresses into first and second sets each containing the addresses, and
   b2) sorting the first set of addresses into the first matrix and sorting the second set of addresses into the second matrix.

4. The process of claim 3, wherein step b1) includes steps of:
   i) identifying a plurality of edges between the addresses such that each edge contains two addresses, and each address is unconnected or in not more than two edges,
   ii) linking the edges into a sequence, and
   iii) alternately assigning edges to first and second sets.

5. The process of claim 4, wherein step b2) includes, for each of the first and second sets of addresses, steps of iteratively:
   i) dividing each set of addresses into first and second subsets $S_{r+1}^{2q}$ and $S_{r+1}^{2q+1}$, where q is an index denoting an original set of addresses and r denotes an iteration stage, and
   ii) placing the first and second subsets into respective rows of the respective first and second matrix, until each row contains no more than one address of a location in each memory.

6. The process of claim 3, wherein step b2) includes, for each of the first and second sets of addresses, steps of iteratively:
   i) dividing the set of addresses into first and second subsets $S_{r+1}^{2q}$ and $S_{r+1}^{2q+1}$, where q is an index denoting an original set of addresses and r denotes an iteration stage, and
   ii) placing the first and second subsets into respective rows of the respective first and second matrix, until each row contains no more than one address of a location in each memory.

7. The process of claim 1, wherein step (d) comprises steps of:
   d1) selecting a row of addresses in a first or second matrix;
   d2) selecting a row of coordinates in the third or fourth matrix corresponding to the row of addresses selected in the first or second matrix, and
   d3) addressing the memories with addresses in the function matrix at coordinates selected from the third or fourth matrix.

8. An integrated circuit containing a turbo decoder for selecting an address of an addressable location in each of a plurality of memories of up to n memories so that the selected addressable locations can be accessed in parallel, the turbo decoder comprising:
   apparatus implemented at least in part in the integrated circuit and defining a function matrix having unique coordinates containing addresses of the addressable locations in the memories;
   a decomposer in the integrated circuit for decomposing at least a set of parallel concatenated convolutional codes, the decomposer comprising:

apparatus implemented at least in part in the integrated circuit and defining first and second matrices, each having m rows and n columns, sorting apparatus in the integrated circuit for sorting a set of addresses of addressable locations to unique coordinate locations in the first and second matrices such that each row of the first and second matrices contains no more than one address of a location in any one memory, and apparatus implemented at least in part in the integrated circuit and defining third and fourth matrices, each having m rows and n columns, and containing entries identifying coordinates of addresses in the function matrix and arranged so that each entry in the third matrix is at coordinates that match coordinates in the first matrix containing an address, and each entry in the fourth matrix is at coordinates that match coordinates in the second matrix containing an address; and decoder apparatus in the integrated circuit responsive to entries in the function, first, second, third and fourth matrices for decomposing the convolutional codes to select an address of an addressable location in each of the plurality of memories.

9. The integrated circuit of claim 8, wherein the function matrix contains addresses from the first and second matrices arranged for parallel access.

10. The integrated circuit of claim 8, wherein the decomposer includes:

an organizer in the integrated circuit for organizing the addresses into first and second sets each containing the addresses, and a sorter in the integrated circuit for sorting the first set of addresses into the first matrix and sorting the second set of addresses into the second matrix.

11. The integrated circuit of claim 10, wherein the organizer includes:

an edge identifier in the integrated circuit for identifying a plurality of edges between the addresses such that each edge contains two addresses, and each address is unconnected or in not more than two edges, a linker in the integrated circuit for linking the edges into a sequence, and an assignor in the integrated circuit for alternately assigning edges to first and second sets.

12. The integrated circuit of claim 11, wherein the sorter includes, for each set:

a divider in the integrated circuit for dividing each set of addresses into first and second subsets $S_{r+1}^{2q}$ and $S_{r+1}^{2q+1}$, where q is an index denoting an original set of addresses and r denotes an iteration stage, placer apparatus in the integrated circuit for placing the first and second subsets into respective rows of the respective first and second matrix, and iteration apparatus in the integrated circuit for iteratively repeating operation of the divider and placer until each row contains no more than one address of a location in each memory.

13. The integrated circuit of claim 12, wherein the set of codes is arranged as coordinates in the function matrix and represents a function $f:\{0,1,2,3, \ldots, n*m-1\} \to f:\{0,1,2,3, \ldots, 2^k-1\}$, where k is a total number of iteration stages.

14. The integrated circuit of claim 10, wherein the sorter includes, for each set:

a divider in the integrated circuit for dividing each set of addresses into first and second subsets $S_{r+1}^{2q}$ and $S_{r+1}^{2q+1}$, where q is an index denoting an original set of addresses and r denotes an iteration stage, placer apparatus in the integrated circuit for placing the first and second subsets into respective rows of the respective first and second matrix, and iteration apparatus in the integrated circuit for iteratively repeating operation of the divider and placer until each row contains no more than one address of a location in each memory.

15. The integrated circuit of claim 14, wherein the set of codes is arranged as coordinates in the function matrix and represents a function $f:\{0,1,2,3, \ldots, n*m-1\} \to f:\{0,1,2,3, \ldots, 2^k-1\}$, where k is a total number of iteration stages.

16. The integrated circuit of claim 8, wherein the decoder apparatus comprises:

apparatus in the integrated circuit for selecting a row of addresses in the first or second matrix;

apparatus in the integrated circuit for selecting a row of coordinates in the third or fourth matrix that corresponds to the row of addresses selected in the first or second matrix, and address apparatus in the integrated circuit for addressing the memories using addresses in the function matrix at coordinates selected from the third or fourth matrix.

* * * * *